US010411167B2

(12) United States Patent
Koyama et al.

(10) Patent No.: US 10,411,167 B2
(45) Date of Patent: Sep. 10, 2019

(54) SEMICONDUCTOR LIGHT EMITTING APPARATUS, STEM PART

(71) Applicant: SUMITOMO ELECTRIC INDUSTRIES, LTD., Osaka (JP)

(72) Inventors: Koichi Koyama, Yokohama (JP); Akira Furuya, Yokohama (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 0 days.

(21) Appl. No.: 15/791,957

(22) Filed: Oct. 24, 2017

(65) Prior Publication Data
US 2018/0122995 A1 May 3, 2018

(30) Foreign Application Priority Data
Oct. 27, 2016 (JP) .................. 2016-210773

(51) Int. Cl.
*H01L 33/48* (2010.01)
*H01L 33/62* (2010.01)
(Continued)

(52) U.S. Cl.
CPC ............ *H01L 33/483* (2013.01); *H01L 24/48* (2013.01); *H01L 33/62* (2013.01); *H01L 33/647* (2013.01); *H01L 2224/4823* (2013.01); *H01L 2224/48091* (2013.01); *H01L 2224/48245* (2013.01); *H01L 2224/48249* (2013.01); *H01L 2224/49111* (2013.01); *H01L 2924/12041* (2013.01); *H01L 2924/12042* (2013.01); *H01L 2924/163* (2013.01); *H01L 2924/16251* (2013.01); *H01L 2924/19107* (2013.01)

(58) Field of Classification Search
CPC ..... H01L 33/483; H01L 33/62; H01L 33/647; H01L 24/48; H01L 2224/48245; H01L 2924/12041; H01L 2924/12042
USPC .......................................................... 257/99
See application file for complete search history.

(56) References Cited

U.S. PATENT DOCUMENTS 5,578,863 A * 11/1996 De Poorter ........... H01S 5/0021
257/432
2007/0228405 A1 10/2007 Tateiwa et al.
(Continued)

FOREIGN PATENT DOCUMENTS

JP H4-028282 1/1992
WO 2013-080396 6/2013

*Primary Examiner* — Tong-Ho Kim
(74) *Attorney, Agent, or Firm* — Smith, Gambrell & Russell, LLP.

(57) ABSTRACT

A semiconductor light emitting apparatus includes: a stem part having a stem base, a lead terminal, and a metal member having a closed shape, the stem base having an inner portion having a first face, a second face and an opening extending in a first direction from the first face to the second face, and an outer portion surrounding the inner portion, the inner and outer portions being arranged along a reference plane intersecting the first direction, the lead terminal being supported in the opening, and the metal member being disposed on the outer portion so as to surround the inner portion and having a first portion supported by a top face of the outer portion, and a second portion extending outward with reference to an edge of the outer portion; a semiconductor optical element disposed on the inner portion; and a cap disposed on the metal member.

16 Claims, 6 Drawing Sheets

(51) Int. Cl.
*H01L 33/64* (2010.01)
*H01L 23/00* (2006.01)

(56) References Cited

U.S. PATENT DOCUMENTS

2008/0025678 A1    1/2008  Yabe
2014/0241388 A1*  8/2014  Yamanaka .......... H01S 5/02212
                                                  372/43.01

* cited by examiner

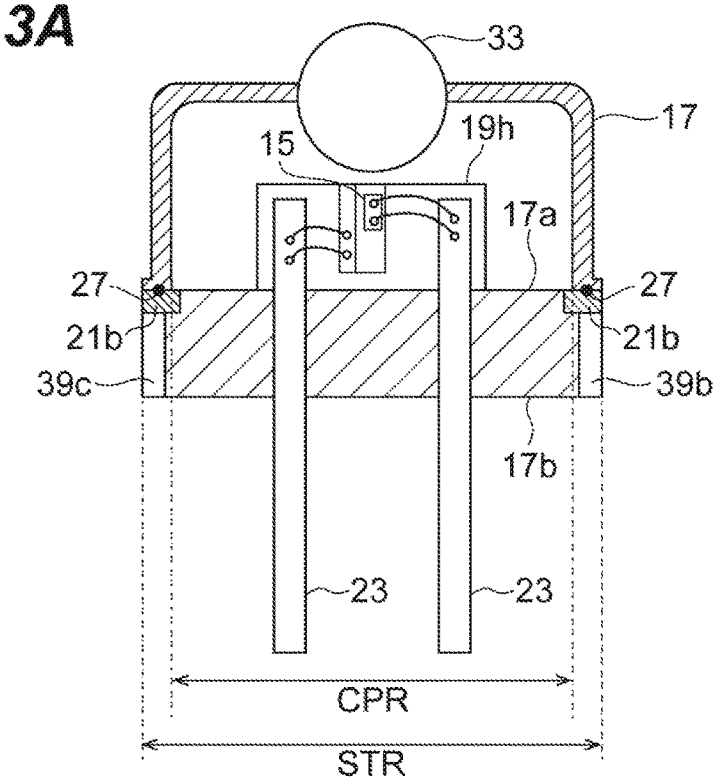
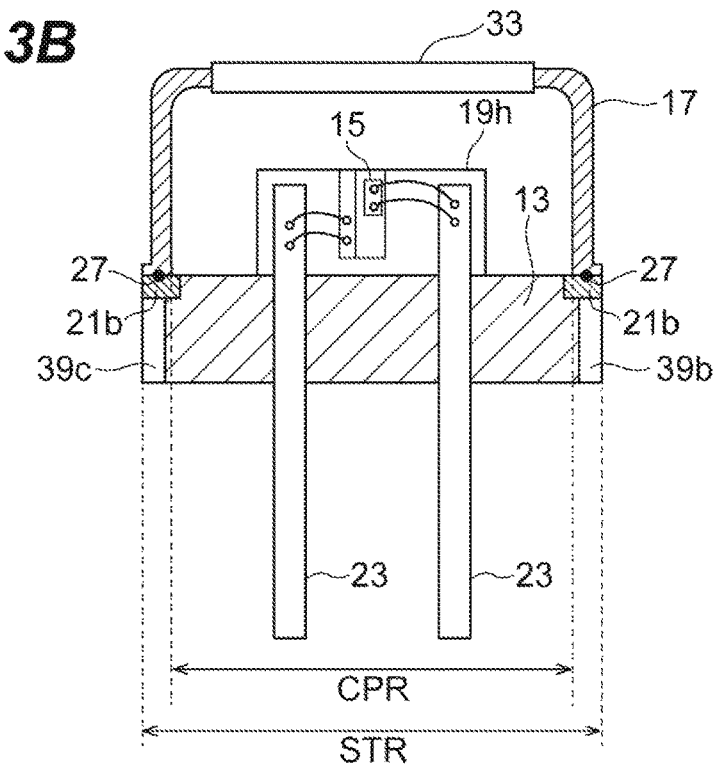

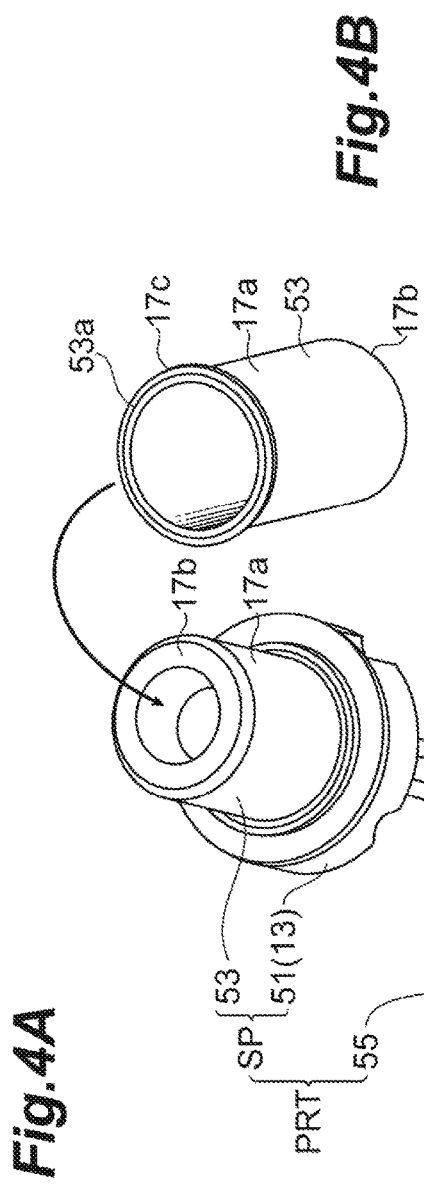
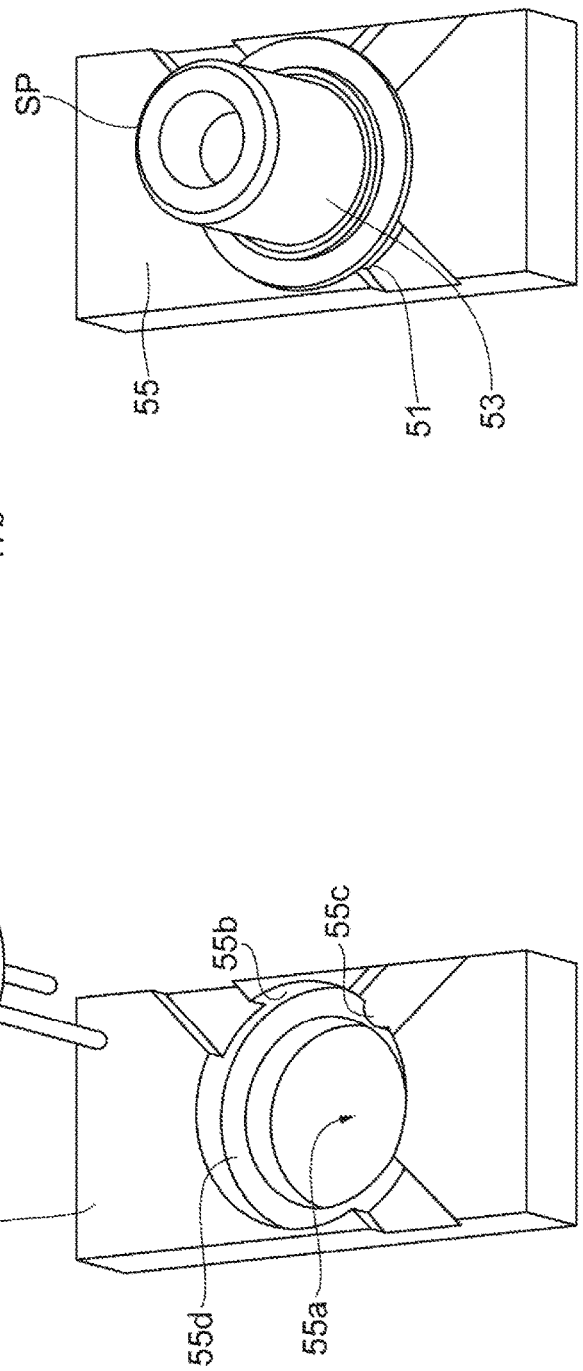
Fig.4A
Fig.4B

SEMICONDUCTOR LIGHT EMITTING APPARATUS, STEM PART

BACKGROUND OF THE INVENTION

Field of the Invention

The present invention relates to a semiconductor light emitting apparatus and a stem part for a semiconductor light emitting apparatus. This application claims the benefit of priority from Japanese Patent application No. 2016-210773 filed on Oct. 27, 2016, which is herein incorporated by reference in its entirety.

Related Background Art

International Publication WO2013-080396, which is referred to as Patent Document 1, discloses a nitride semiconductor light emitting apparatus. Japanese Unexamined Patent Application Publication No. 04-028282, which is referred to as Patent Document 2, discloses a semiconductor laser unit.

SUMMARY OF THE INVENTION

A semiconductor light emitting apparatus according to one aspect of the present invention includes: a stem part having a stem base, a lead terminal, and a metal member, the stem base having an inner portion and an outer portion, the inner portion having a first face, a second face and an opening, the opening extending in a first direction from the first face to the second face, the outer portion surrounding the inner portion, the lead terminal being supported in the opening, and the metal member having a closed shape and being disposed on the outer portion so as to surround the inner portion; a semiconductor optical element disposed on the inner portion; and a cap disposed on the metal member, the inner portion and the outer portion being arranged along a reference plane intersecting the first direction, and the metal member having a first portion supported by a top face of the outer portion, and a second portion extending outward with reference to an edge of the outer portion.

A stem part according to another aspect of the present invention includes: a stem base having an inner portion and an outer portion, the inner portion having a first face, a second face and an opening, the opening extending in a first direction from the first face to the second face, the outer portion being disposed outside the inner portion; a lead terminal supported in the opening; and a metal member having a closed shape and being disposed on a top face of the outer portion and a side face of the inner portion so as to surround the inner portion, the inner portion and the outer portion being arranged along a reference plane intersecting the first direction, and the metal member having a portion extending outward with reference to an edge of the outer portion.

BRIEF DESCRIPTION OF THE DRAWINGS

The above-described objects and the other objects, features, and advantages of the present invention become more apparent from the following detailed description of the preferred embodiments of the present invention proceeding with reference to the attached drawings.

FIGS. 3A and 3B are schematic views each showing a coaxial type optical module according to the present embodiment of the semiconductor light emitting apparatus.

FIGS. 4A and 4B are schematic views each showing a major step in a method for fabricating the semiconductor light emitting apparatus according to the present embodiment.

DESCRIPTION OF THE EMBODIMENTS

Figure 1:
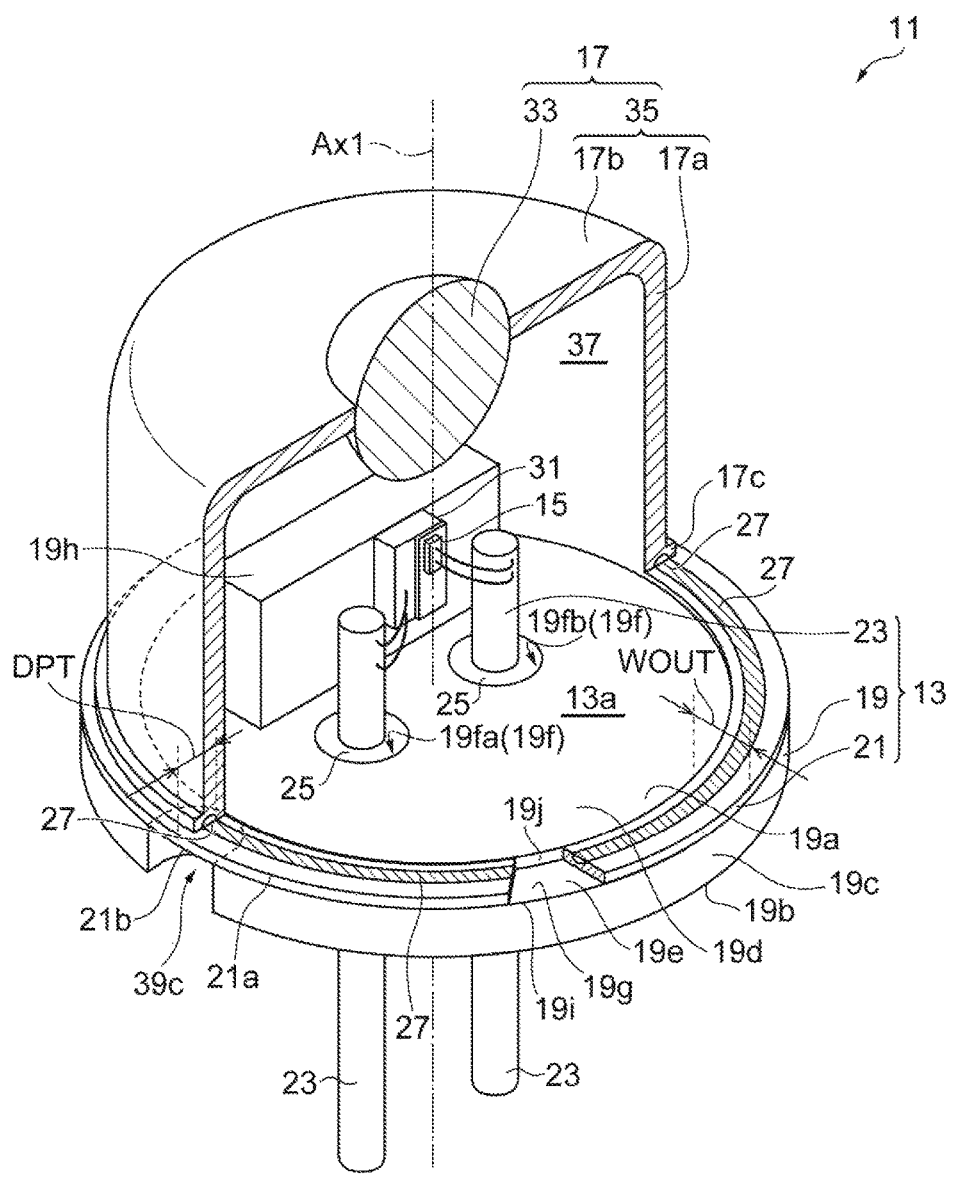
FIG. 1 is a schematic partially broken view showing a semiconductor light emitting apparatus according to the present embodiment.

The nitride semiconductor light emitting apparatus in Patent Document 1 includes a base mount, a post, and a welding base provided on a principal surface of the base mount. The base mount has a level difference provided in the principal region to form a step.

The welding base is fixed to the base mount so as to surround the post on the base mount. The welding base is far from the outer edge of the base mount at any position on the edge.

Patent Document 2 discloses a laminate structure including a first stem plate and a second stem plate. The first stem plate includes a steel plate and a carbon steel thin plate laminated to the steel plate. The carbon steel thin plate has an upper face which is the same shape as that of the steel plate.

The stem has a pedestal which mounts a semiconductor light emitting element, and the pedestal provides the semiconductor light emitting element with a heat dissipation path. The stem also mounts a cap, which is welded to the stem by resistance welding, and the stem and the cap thus welded form a container with a cavity receiving therein the pedestal and the semiconductor light emitting element airtightly sealed. Studies conducted by the inventors reveal that the pedestal of a greater size can provide, for example, a higher heat dissipation performance, but requires the cavity to have a sufficient space for this pedestal.

What is needed is to provide a stem that can enlarge the cavity at a given size of the stem.

It is an object of one aspect of the present invention to provide a semiconductor light emitting apparatus including a stem that makes it possible to locate the bottom end of a cap close to the outer edge of the step. It is an object of another aspect of the present invention to provide a stem for the semiconductor light emitting apparatus.

Some specific embodiments according to the present above aspects will be described below.

A semiconductor light emitting apparatus according to an embodiment includes: (a) a stem part having a stem base, a lead terminal, and a metal member, the stem base having an inner portion and an outer portion, the inner portion having a first face, a second face and an opening, the opening extending in a first direction from the first face to the second face, the outer portion surrounding the inner portion, the lead terminal being supported in the opening, and the metal member having a closed shape and being disposed on the outer portion so as to surround the inner portion; (b) a semiconductor optical element disposed on the inner portion; and (c) a cap disposed on the metal member, the inner portion and the outer portion being arranged along a reference plane intersecting the first direction, and the metal member having a first portion supported by a top face of the outer portion, and a second portion extending outward with reference to an edge of the outer portion.

The semiconductor light emitting apparatus allows the cap and the stem part, the metal member of which is joined to the cap, to provide a cavity accommodating the semiconductor optical element.

The stem base has one or more sections having positioning recesses, each of which is used in welding the cap to the stem part, on the side face of the outer portion of the stem base, and one or more remaining sections having no positioning recess. Each of the positioning recesses extends in a direction from the outer portion to the inner portion, and is defined by the side face of the stem base extending in the first direction. In the metal member, the first portion is supported by the top face of the outer portion, and the second portion protrudes beyond the outer edge of the top face of the outer portion so as to form an eave. The metal member provided with the second portion makes it possible to locate the bottom end of the cap close to the outer edge of the metal member, not the stem base, without being limited in size by the outer portion of the stem base having the top face which the recess of the outer portion sets back inward.

In the semiconductor light emitting apparatus according to an embodiment, the cap has an end, and the end of the cap is welded to the metal member to form a weld zone, and the weld zone traverses the second portion of the metal member.

The semiconductor light emitting apparatus allows not only the first portion of the metal member but also the second portion of the metal member to support the cap. The stem part and the cap are joined at a closed welded line by welding to form a cavity hermetically sealed.

A stem part according to an embodiment includes: (a) a stem base having an inner portion and an outer portion, the inner portion having a first face, a second face and an opening, the opening extending in a first direction from the first face to the second face, the outer portion being disposed outside the inner portion; (b) a lead terminal supported in the opening; and (c) a metal member having a closed shape and being disposed on a top face of the outer portion and a side face of the inner portion so as to surround the inner portion, the inner portion and the outer portion being arranged along a reference plane intersecting the first direction, and the metal member having a portion extending outward with reference to an edge of the outer portion.

The stem part includes the metal member that is disposed on the side face of the inner portion and the top face of the outer portion to allow the cap to locate thereon. The metal member also has the second portion, extending outside the outer portion, in addition to the first portion supported by the top face of the outer portion. The metal member having the second portion makes it possible to use a cap having a size that does not depend upon the shape of the stem base (the edge of the outer portion).

In the stem part according to an embodiment, the stem base comprises metal having a larger thermal conductivity than that of the metal member.

The stem part makes it possible to provide a good weld by resistance welding independently of metal materials of the positioning tool and the stem base.

In the stem part according to an embodiment, the metal member reaches an edge of the outer portion.

The stem part allows the stem base to support the most part of the metal member in the periphery of the stem base.

Teachings of the present invention can be readily understood by considering the following detailed description with reference to the accompanying drawings shown as examples. Referring to the accompanying drawings, embodiments of a semiconductor optical apparatus, a stem part, and a method for fabricating a semiconductor optical apparatus according to the present invention will be described. To facilitate understanding, identical reference numerals are used, where possible, to designate identical elements that are common to the figures.

Figure 2A:
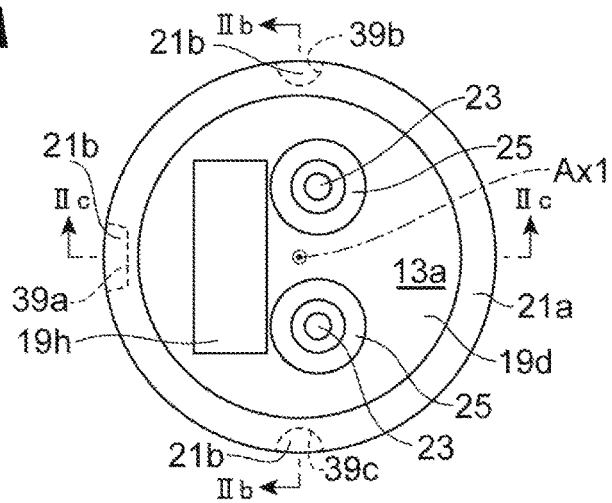
FIG. 2A is a schematic plan view showing a stem part of the semiconductor light emitting apparatus according to the present embodiment.
Figure 2B:
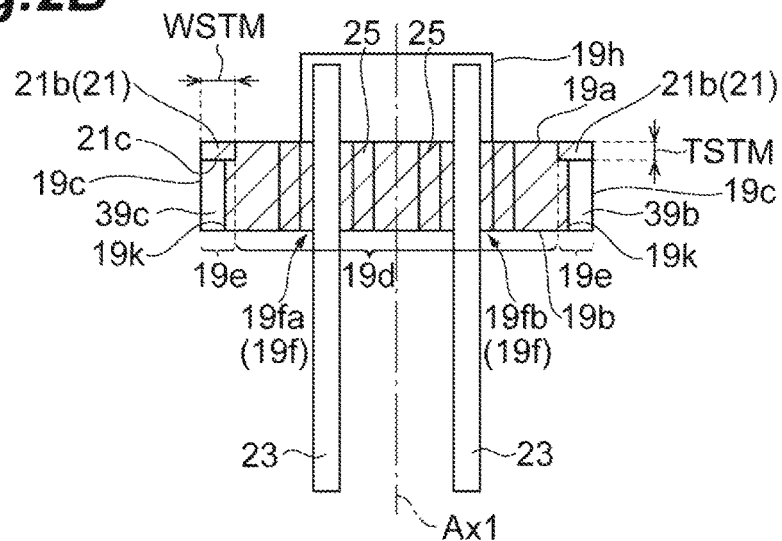
FIG. 2B is a schematic cross sectional view taken along line IIb-IIb shown in FIG. 2A.
Figure 2C:
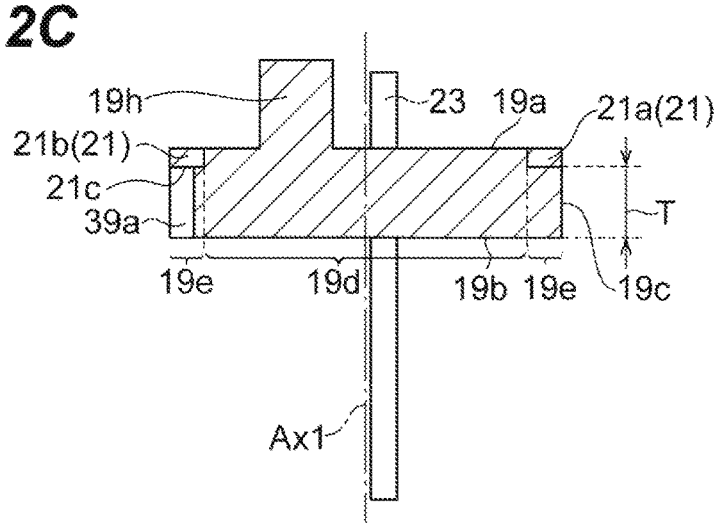
FIG. 2C is a schematic cross sectional view taken along line IIc-IIc shown in FIG. 2A.

FIG. 1 is a schematic partially broken view showing a semiconductor light emitting apparatus according to the present embodiment. FIG. 2A is a schematic plan view showing a stem part of the semiconductor light emitting apparatus according to the present embodiment, and FIG. 2B is a schematic cross sectional view taken along line IIb-IIb shown in FIG. 2A. FIG. 2C is a schematic cross sectional view taken along line IIc-IIc shown in FIG. 2A.

The semiconductor light emitting apparatus 11 includes a stem part 13, a semiconductor optical element 15, and a cap 17. The stem part 13 includes a stem base 19, a metal member 21, and a lead member 23. The stem base 19 includes a first face 19a, a second face 19b, and a side face 19c. Further, the stem base 19 includes an inner portion 19d and an outer portion 19e. The inner portion 19d has openings 19f (19fa, 19fb) each extending in the direction of the first axis Ax1 from the first face 19a to the second face 19b, and the outer portion 19e is provided on the periphery of the inner portion 19d, and specifically has a closed shape to surround the inner portion 19d. The inner and outer portions 19d and 19e are arranged along a reference plane intersecting the direction of the first axis Ax1, and form an integral member. In the present embodiment, the inner portion 19d is raised with respect to the top face 19g of the outer portion 19e to form a step, and the raised portion forms a difference in level defined by the side face 19j of the inner portion 19d. The top face 19g of the outer portion 19e is lowered with reference to the inner portion 19d by the thickness of the metal member 21. The top face 19g of the outer portion 19e has a width WOUT (the length in the direction from the inner portion to the outer portion) of, preferably, for example, about 750 to 950 micrometers in view of the misalignment of the cap 17. The width of the top face 19g is larger than the depth of the indent 39 on the above side face of the stem base. The stem base 19 is made of, for example, copper or a copper alloy. The metal member 21 has a closed shape, and is provided on the top face 19g of the outer portion 19e so as to encircle the inner portion 19d of the stem base 19 on the top face 19g of the outer portion 19e. The metal member 21 includes a metal of a thermal conductivity smaller than that of the stem base 19. The metal member 21 is made of, for example, iron, an iron nickel alloy or an iron nickel cobalt alloy. In the stem base 19, the inner portion 19d preferably includes a metal of a thermal conductivity larger than that of the metal member 21. In the first portion 21a of the metal member 21, the metal member 21 reaches the outer edge 19i of the outer portion 19e of the stem base 19.

In order to avoid the passing-through of a weld zone formed by resistance welding, as shown in FIG. 2B, the metal member 21 preferably has a thickness TSTM, for example, 100 micrometers or more. In order to secure a heat radiation pass through the side face 19c of the stem base 19, the thickness TSTM of the metal member 21 is preferably, for example, 350 micrometers or less. In addition, the metal member 21 has a width WSTM of 750 micrometers or more, which allows resistance welding of the cap 17. The metal member 21 has a first portion 21a and a second portion 21b. The first portion 21a is supported by the top face 19g of the outer portion 19e. The second portion 21b extends beyond the edge 19i of the outer portion 19e so as to form a bridge 21c in a circumferential direction. The bridge 21c is supported on the top face 19g in two directions or three directions by the first portion 21a or the first portion 21a and the second portion 21b. The metal member 21 can be bonded to the stem base 19 with an adhesive, such as a silver solder (equivalent to JIS BAg-8), and more specifically bonded to the top face 19g of the outer portion 19e and the side face 19c of the inner portion 19d.

Referring to FIG. 1, the semiconductor optical element 15 is disposed on the inner portion 19d of the stem base 19. In the present embodiment, the stem part 13 includes a pedestal 19h disposed on the inner portion 19d, and the pedestal 19h protrudes in the direction of the first axis Ax1 with reference to the first face 19a of the inner portion 19d. The semiconductor optical element 15 is disposed on the side face of the pedestal 19h. The semiconductor optical element 15 includes, for example, a laser diode and a light emitting diode (LED). More specifically, the pedestal 19h mounts the sub-mount 31, which mounts the semiconductor optical element 15, on the side face thereof.

The cap 17 is disposed on the metal member 21 of the stem part 13. In particular, the cap 17 includes an optical window component 33 and a cap base 35. The cap base 35 has a side wall 17a and a ceiling 17b, and the side wall 17a has one end 17c fixed to the metal member 21 of the stem part 13. Preferably, the one end 17c of the side wall 17a is fixed to the face of the metal member 21 by a welded portion 27, and the stem part 13 and the cap 17 form a cavity 37 that are air-tightly sealed. Specifically, the welded portion 27 is provided on one end 17c of the side wall 17a and the surface of the metal member 21, and has a closed shape. The side wall 17a has another end portion connected to the ceiling 17b, and the ceiling 17b supports the optical window component 33, such as a lens or a glass base. The optical window component 33 is optically coupled with the semiconductor optical element 15.

The lead member 23 is provided for electrical connection to the semiconductor optical element 15. Further, the lead member 23 passes through the opening 19f of the stem base 19, and is supported by the sealing material 25 filled in the opening 19f. The sealing member 25 incudes a metal pipe and glass. The lead member 23 extends in the direction of the first axis Ax1 in the opening 19f. The lead member 23 is electrically connected to the semiconductor optical element 15. In the present embodiment, the semiconductor optical element 15 can be connected to the lead member 23, such as a lead pin, via an interconnecting member, such as a bonding wire, and can be connected to the lead member 23 via an interconnect on the sub-mount 31, such as a wiring layer of the sub-mount 31.

The semiconductor light emitting apparatus 11 allows the stem part 13 and the cap 17, which is joined to the metal member 21 of the stem part 13, to provide the cavity 37 containing the semiconductor optical element 15 therein. The outer portion 19e of the stem base 19 includes a portion with a recess 39 (specifically, three recesses 39a, 39b, and 39c), located on the side face 19k of the outer portion 19e of the stem base 19, for positioning in welding the cap 17 to the stem part 13, and a remaining portion without any recess 39 (39a, 39b, and 39c), The recess 39 (39a, 39b, and 39c) extends inward, specifically, in a direction from the side face 19k of the outer portion 19e to the inner portion 19d, and the side faces 19c defining the recesses 39a, 39b, and 39c extend in the direction of the first axis Ax1 from the top face 19g of the outer portion 19e to the second face 19b. The metal member 21 includes a first portion 21a supported by the top face 19g of the outer portion 19e, and in addition to the first portion 21a, a second portion 21b extending beyond the edge 19i of the top face 19g of the outer portion 19e to form peaked extensions blocking the openings of the recesses 39a, 39b, and 39c. The metal member 21 having the second portion 21b makes it possible for one end 17c of the cap 17 to be close to the edge 19i of the outer portion 19e and the edge 21j of the metal member 21 without being limited in size by the principal surface 13a set back by the recesses 39a, 39b, and 39c of the outer portion 19e.

As shown in FIG. 1, the welded portion 27, which join the metal member 21 of the stem part 13 and the end 17c of the cap 17 to each other, crosses the second portion 21b of the metal member 21, so that the cap 17 is supported by both the first portion 21a and the second portion 21b. The stem part 13 and the cap 17 are secured by a closed weld zone 27 to form the cavity 37 that is hermetically sealed.

Referring to FIG. 3A, the cap 17 supports an optical window component 33, such as a collimating lens. The semiconductor optical element 15 in the cavity 37 may be optically coupled to an external optical component via the collimating lens. Referring to FIG. 3B, the cap 17 supports an optical window component 33, such as a glass substrate, which can be transparent to light to/from the semiconductor optical element 15. The semiconductor optical element 15 in the cavity 37 is optically coupled to an external optical component via, for example, a transparent substrate. The semiconductor light emitting apparatuses 11 shown in FIGS. 3A and 3B are referred to as, for example, a coaxial type optical module. The coaxial optical module has such a size as to be contained within, for example, a cylinder which extends coaxially and has a diameter of 10 millimeters or less. The ratio (CPR/STR) of the inner diameter CPR of the cap 17 to the outer diameter STR of the stem part 13 can be, for example, 0.5 or more.

With reference to FIGS. 4A and 4B, FIG. 5, and FIGS. 6A and 6B, a detailed description will be given on major steps in a method for fabricating a semiconductor light emitting apparatus according to the present embodiment. As shown in FIG. 4A, a stem assembly 51 and a cap part 53 are prepared. The stem assembly 51 includes a stem part (referred to as "stem part 13" for simplicity) and a semiconductor optical element 15 die-bonded onto the inner portion 19d of the stem part 13. The cap has not been resistance-welded yet to the stem part, and strictly speaking, the stem part 13 referred in this process is different from the stem part 13 shown in FIG. 1 in that a melted part working as the welded portion 27 has not been formed in the present stem part. Like the cap 17, the cap part 53 has a side wall 17a and a ceiling 17b. The cap part 53 has not been bonded yet to the stem part by resistance welding, and strictly speaking, the cap part 53 in this step is also different from the cap 17 shown in FIG. 1 in that a welding protrusion (a fusion protrusion 53a in FIG. 6A) for the welded portion 27 remains on the bottom face of one end 17c of the side wall 17a.

Figure 5:
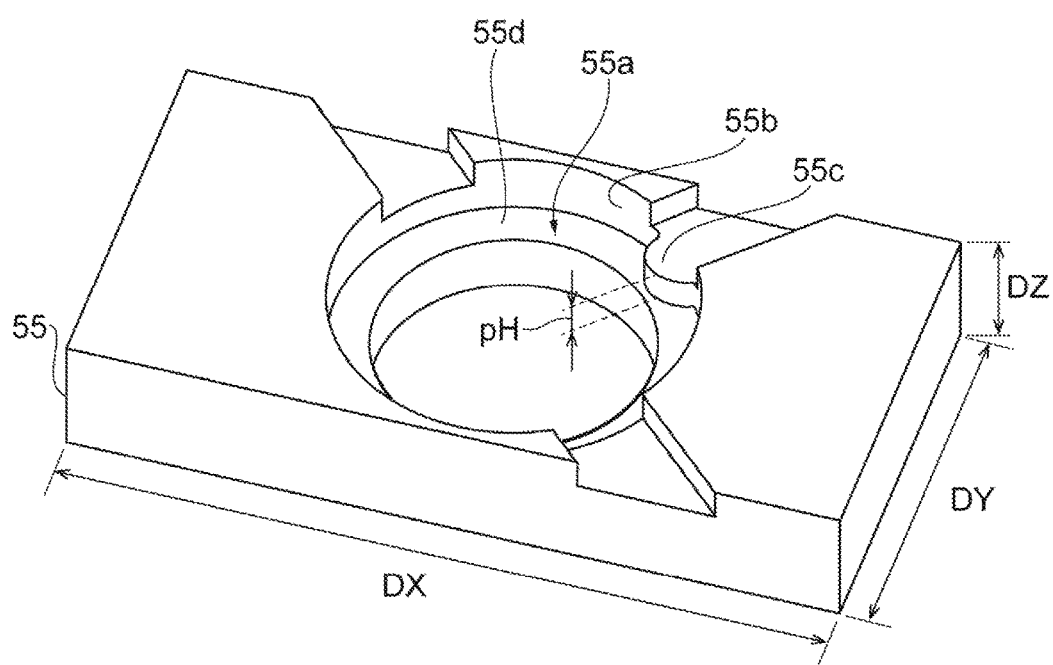
FIG. 5 is a schematic view showing an exemplary alignment tool which can be used in the method for fabricating the semiconductor light emitting apparatus according to the present embodiment.

A positioning tool 55 is prepared. As shown in FIG. 5, the positioning tool 55 includes a recess 55a for receiving the stem assembly 51 therein. The recess 55a includes a guide face 55b which can guide the side face 19c of the stem base 19 in installing the stem assembly 51 in the positioning tool 55, and an orientation protrusion 55c which is used to determine the orientation of the stem assembly 51 with respect to the positioning tool 55. The recess 55a has a bottom face 55d that supports the back face (the second face 13b) of the stem assembly 51. The orientation projection 55c has a height PH associated with the thickness T of the outer portion 19e of the stem base 19 in the recess 39a of the stem base 19, and the tolerance with respect to this thickness T ranges from, for example, −50 to +50 micrometers . The tolerance for the height PH ranges from, for example, −50 to +50 micrometers. The positioning tool 55 can be made of a metal, such as aluminum. Referring to FIG. 5, the major dimensions of the positioning tool 55 in the present embodiment are listed below for easy understanding.

Exemplary size of the positioning tool 55 made of aluminum.
DX: 12 mm
DY: 6 mm.
DZ: 2 mm As shown in FIG. 4B, the stem assembly 51 and the cap part 53 are arranged on the positioning tool 55. Specifically, the stem base 19 and the lead member 23 of the stem assembly 51 are inserted into the recess 55a of the positioning tool 55, and if needed, the stem assembly 51 is rotated about the axis to latch the recess 39a of the stem assembly 51 to the orientation projection 55c of the positioning tool 55.

Figure 6A:
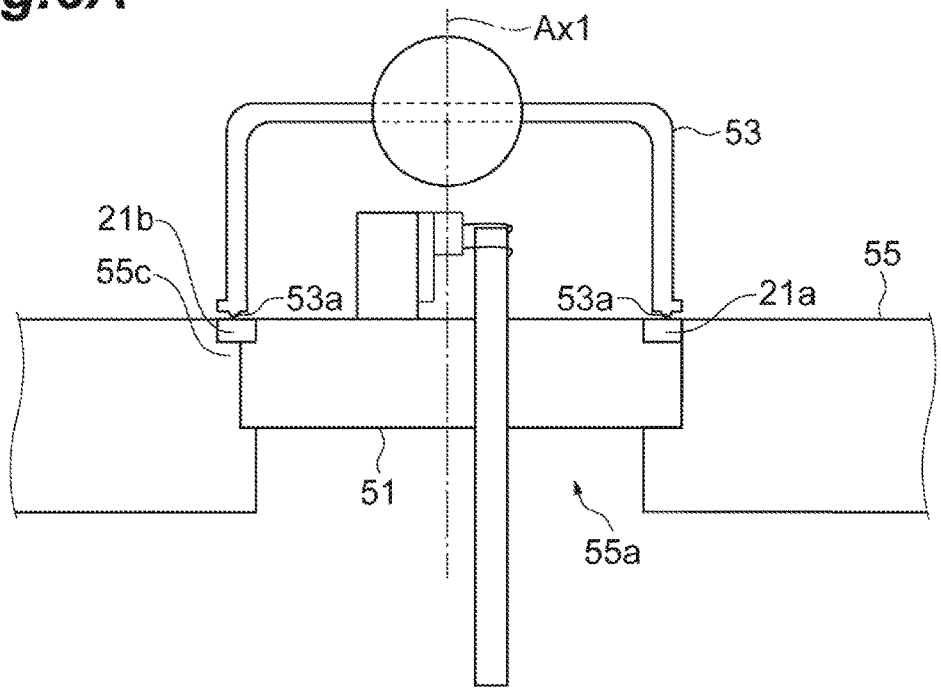
FIGS. 6A and 6B are schematic views each showing a major step in a method for fabricating the semiconductor light emitting apparatus according to the present embodiment.

As shown in FIG. 6A, the second portion 21b of the metal member 21 in the stem assembly 51 thus latched is positioned between the bottom face of the orientation projection 55c and the one end 17c of the cap component 53, and the fusion projection 53a of the cap part 53 is in direct contact with the principal surface of the stem assembly 51.

Figure 6B:
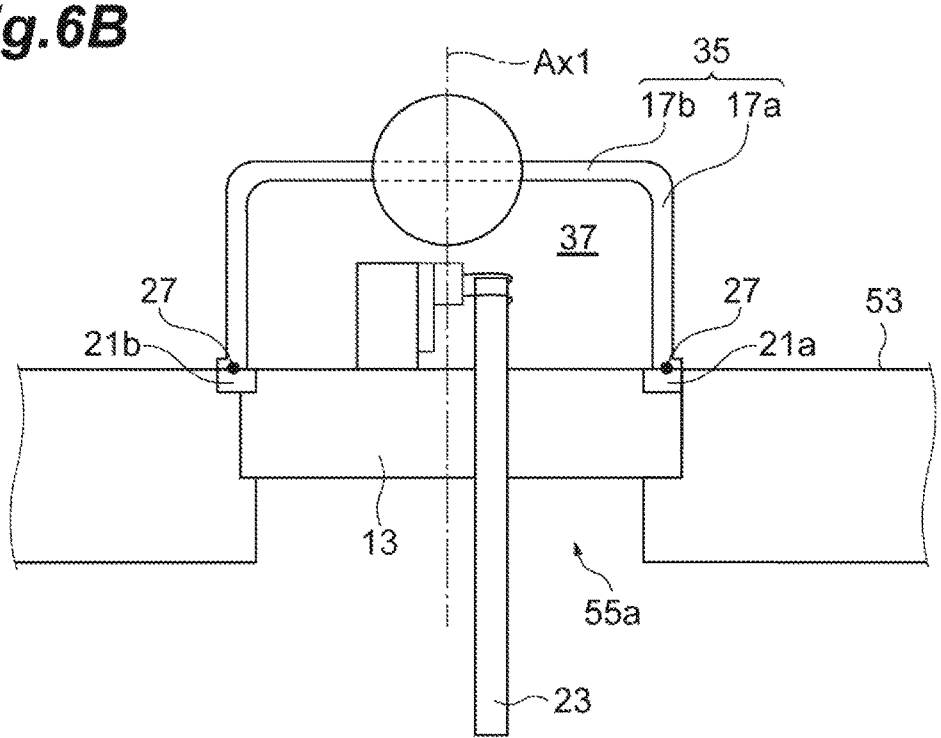

The stem assembly 51 and the cap part 53 installed in the positioning tool 55 is subjected to resistance welding by applying current to between the cap part 53 and the positioning tool 55, so that as shown in FIG. 6B, the stem assembly 51 and the cap part 53 are welded together. This welding provides the semiconductor light emitting apparatus with the cavity 37 to bring the fabrication to completion. The present method for fabricating the semiconductor light emitting apparatus 11 allows the cap 17 to have a size that depends upon not the shape of the stem base 19 (the edge 19i of the outer portion 19e) but the size of the metal member 21.

The method for fabricating the semiconductor light emitting apparatus 11 makes it possible to bring the outer edge of the one end 17c of the cap 17 close to the edge of the principal surface 13a of the stem part 13.

Having described and illustrated the principle of the invention in a preferred embodiment thereof, it is appreciated by those having skill in the art that the invention can be modified in arrangement and detail without departing from such principles. We therefore claim all modifications and variations coining within the spirit and scope of the following claims.

What is claimed is:

1. A semiconductor light emitting apparatus comprising:
a stem part having a stem base, a lead terminal, and a metal member, the stem base having an inner portion and an outer portion, the inner portion having a first face, a second face and an opening, the opening extending in a direction along an axis from the first face to the second face, the outer portion surrounding the inner portion, the lead terminal being supported in the opening, and the metal member having a closed shape and being disposed on the outer portion so as to surround the inner portion;
a semiconductor optical element disposed on the inner portion; and
a cap disposed on the metal member,
the inner portion and the outer portion being arranged along a reference plane intersecting the axis,
the outer portion having a top face, a side face, and a recess in the side face, and
the metal member having a first portion disposed on the top face of the outer portion, and a second portion extending outward with reference to an edge of the outer portion so as to form a bridge in a circumferential direction.

2. The semiconductor light emitting apparatus according to claim 1, wherein
the cap has an end welded to the metal member to form a weld zone, and
the weld zone traverses the second portion of the metal member.

3. A stem part comprising:
a stem base having an inner portion and an outer portion, the inner portion having a first face, a second face and an opening, the opening extending in a direction along an axis from the first face to the second face, the outer portion being disposed outside the inner portion;
a lead terminal supported in the opening; and
a metal member having a closed shape and being disposed on a top face of the outer portion and a side face of the inner portion so as to surround the inner portion;
the inner portion and the outer portion being arranged along a reference plane intersecting the axis,
the outer portion having a side face and a recess in the side face, and
the metal member having a first portion disposed on the top face of the outer portion and a second portion extending outward with reference to an edge of the outer portion so as to form a bridge in a circumferential direction.

4. The stem part according to claim 3, wherein the stem base comprises metal having a larger thermal conductivity than that of the metal member.

5. The stem part according to claim 3, wherein the metal member reaches an edge of the outer portion.

6. A semiconductor light emitting apparatus comprising:
a cap;
a semiconductor optical element; and
a stem part, the stein part including:
a metal stem base having an inner portion and an outer portion outside the inner portion, the inner portion having a first face, a second face and an opening extending in a direction along an axis from the first face to the second face, the inner portion and the outer portion being arranged along a reference plane intersecting the axis, and the outer portion providing an outer edge of the metal stem base and a side face for the metal stem base, the side face having a recess;
a lead terminal support in the opening; and
a metal member having a closed shape with a first portion and a second portion, the metal member being disposed on a side face of the inner portion so as to surround the inner portion, the first portion of the metal member being on the top face of the outer portion and the second portion of the metal member extending from the first portion thereof to bridge over the recess, wherein
the cap is disposed on the metal member, and
the semiconductor optical element is disposed on the inner portion.

7. The semiconductor light emitting apparatus according to claim 6, wherein the metal member has a portion that extends beyond the outer edge provided by the outer portion.

8. The semiconductor light emitting apparatus according to claim 6, wherein the top face and the side face of the outer portion meet at the outer edge.

9. The semiconductor light emitting apparatus according to claim 6, wherein the first portion of the metal member extends over the top face of the outer portion to the outer edge provided by the outer portion.

10. The semiconductor light emitting apparatus according to claim 6, wherein the first portion of the metal member is between the side face of the inner portion and the side face of the outer portion.

11. The semiconductor light emitting apparatus according to claim 6, wherein, in the metal member, the first portion and the second portion are arranged in a circumferential direction thereof.

12. The semiconductor light emitting apparatus according to claim 6, wherein
the cap has an end welded to the metal member to form a weld zone in the first portion and the second portion of the metal member, and
the cap is apart front the inner portion.

13. The semiconductor light emitting apparatus according to claim 12, wherein the weld zone traverses the outer edge.

14. The semiconductor light emitting apparatus according to claim 6, wherein the outer portion has a thickness smaller than that of the inner portion in the direction.

15. The semiconductor light emitting apparatus according to claim 6, wherein the inner portion is raised with respect to the top face of the outer portion to form a step.

16. The semiconductor light emitting apparatus according to claim 6, wherein the top face of the outer portion is lowered with respect to the inner portion.

* * * * *